(12) United States Patent
Lin et al.

(10) Patent No.: US 9,502,508 B2
(45) Date of Patent: Nov. 22, 2016

(54) METHOD FOR MANUFACTURING ISOLATION STRUCTURE INTEGRATED WITH SEMICONDUCTOR DEVICE

(71) Applicant: UNITED MICROELECTRONICS CORP., Hsin-Chu (TW)

(72) Inventors: Hong-Ze Lin, Hsinchu (TW); Chien-Ming Huang, Taichung (TW); Shin-Kuang Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/151,506

(22) Filed: May 11, 2016

(65) Prior Publication Data

US 2016/0254354 A1 Sep. 1, 2016

Related U.S. Application Data

(62) Division of application No. 14/569,772, filed on Dec. 14, 2014.

(30) Foreign Application Priority Data

Nov. 11, 2014 (TW) .............................. 103139109 A

(51) Int. Cl.
*H01L 29/66* (2006.01)
*H01L 21/332* (2006.01)
*H01L 29/10* (2006.01)
*H01L 27/12* (2006.01)
*H01L 23/522* (2006.01)
*H01L 29/78* (2006.01)
*H01L 29/40* (2006.01)
*H01L 29/423* (2006.01)
*H01L 29/06* (2006.01)

(52) U.S. Cl.
CPC ....... *H01L 29/1083* (2013.01); *H01L 23/5223* (2013.01); *H01L 27/124* (2013.01); *H01L 27/1214* (2013.01); *H01L 29/0696* (2013.01); *H01L 29/1095* (2013.01); *H01L 29/66734* (2013.01); *H01L 29/7813* (2013.01); *H01L 29/0649* (2013.01); *H01L 29/402* (2013.01); *H01L 29/42372* (2013.01); *H01L 2924/0002* (2013.01)

(58) Field of Classification Search
CPC ..................... H01L 29/7813; H01L 29/66734
USPC .......................... 438/270, 589; 257/135, 329
See application file for complete search history.

(56) References Cited

U.S. PATENT DOCUMENTS

| 6,921,932 | B1 | 7/2005 | Yu |
| 7,193,262 | B2 | 3/2007 | Ho |
| 8,232,187 | B2 | 7/2012 | Kim |
| 8,809,993 | B2 | 8/2014 | Kwak et al. |
| 9,318,566 | B2 * | 4/2016 | Lee ...................... H01L 29/407 438/270 |

* cited by examiner

*Primary Examiner* — Calvin Lee
(74) *Attorney, Agent, or Firm* — Winston Hsu; Scott Margo

(57) ABSTRACT

A method for manufacturing an isolation structure integrated with semiconductor device includes following steps. A substrate is provided. A plurality of trenched gates is formed in the substrate. A first insulating layer and a second insulating layer are sequentially deposited on the substrate. A first etching process is performed to remove portions of the second insulating layer to expose portions of the first insulating layer. A second etching process is then performed to remove the exposed second insulating layer to expose the trenched gates and to define at least an active region.

13 Claims, 5 Drawing Sheets

METHOD FOR MANUFACTURING ISOLATION STRUCTURE INTEGRATED WITH SEMICONDUCTOR DEVICE

CROSS REFERENCE TO RELATED APPLICATIONS

This application is a division of U.S. application Ser. No. 14/569,772 filed on Dec. 14, 2014, which claims priority to Taiwanese Patent Application Serial No. 103139109, filed on Nov. 11, 2014; the contents of which are hereby incorporated by reference in its entirety.

BACKGROUND OF THE INVENTION

1. Field of the Invention

The invention relates to an isolation structure and a semiconductor device and a manufacturing method thereof, and more particularly, to an isolation structure integrated with a semiconductor device and a manufacturing method.

2. Description of the Prior Art

In recent years, along with the trend for achieving higher packing density in integrated circuit semiconductor devices, active research and development have been in progress, striving for device miniaturization. Furthermore, isolation regions, which are necessary to prevent current short between devices, taking up a considerable portion of a chip, is become more and more important due to the device miniaturization.

Conventionally, the LOCOS (local oxidation of silicon) method has been generally utilized as one of the techniques for forming isolation regions on a substrate. And the conventional process for forming an isolation structure by the LOCOS method is to form a pad oxide layer over a silicon substrate, and a hard mask is then formed thereon. The hard mask and the pad oxide layer are patterned to define location and size of the isolation structure(s) to be formed. Next, the silicon substrate is placed in a high temperature environment with reaction gas such as oxygen, and an oxidation is performed to form field oxide (hereinafter abbreviated as FOX) layers. The FOX layers are used to define active regions on the silicon substrate and to provide electrical isolation between those active regions.

Although FOX layers presently provide many advantages in semiconductor technology, there are still several problems created by their application to a ULSI circuit die, including "birds' beak" effect. The "bird's beak" effect results from the lateral oxidation under edge of the patterned mask and pad oxide layer. The presence of the bird's beak effectively increases the size of the FOX layers, thereby ultimately decreasing the amount of silicon real estate available for later device formation. Furthermore, since LOCOS method needs high temperature, time for performing LOCOS method or forming the FOX layers must be at the beginning of the whole manufacturing steps, otherwise devices formed on the substrate are severely impacted.

Therefore, an isolation structure that is able to provide sufficient electrical isolation, avoid birds' beak effect, and reduce silicon consumption is still in need.

SUMMARY OF THE INVENTION

According to an aspect of the present invention, a method for manufacturing an isolation structure integrated with a semiconductor device is provided. According to the method, a substrate is provided and a plurality of trenched gates is then formed in the substrate. After forming the trenched gates, a first insulating layer and a second insulating layer are sequentially formed on the substrate. Next, a first etching process is performed to remove portions of the second insulating layer to expose portions of the first insulating layer. Then, a second etching process is performed to remove the exposed first insulating layer to expose the trenched gates and to define at least an active region.

According to an aspect of the present invention, an isolation structure integrated with a semiconductor device is provided. The isolation structure integrated with the semiconductor device includes a substrate comprising a front side and a back side, a plurality of trenched gates formed in the substrate, and an isolation structure formed in the front side of the substrate. The isolation structure includes a first insulating layer and a second insulating layer, and a bottom surface of the isolation structure is higher than top surfaces of the trenched gates.

According to the isolation integrated with the semiconductor device and manufacturing method provided by present invention, the isolation structure used to define the active region and provide electrical isolation are formed by depositions after forming the trenched gates. Since the isolation structure is no longer formed by LOCOS method, high-temperature process is not required. Therefore the isolation structure can be formed at other time point, instead of the beginning the whole manufacturing process. And thus process flexibility is improved. More important, because the isolation structure is formed on the substrate by depositions, silicon consumption and birds' beak effect to the substrate are all avoided.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-10 are drawings illustrating a method for manufacturing an isolation structure integrated with a semiconductor device provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

Figure 1:
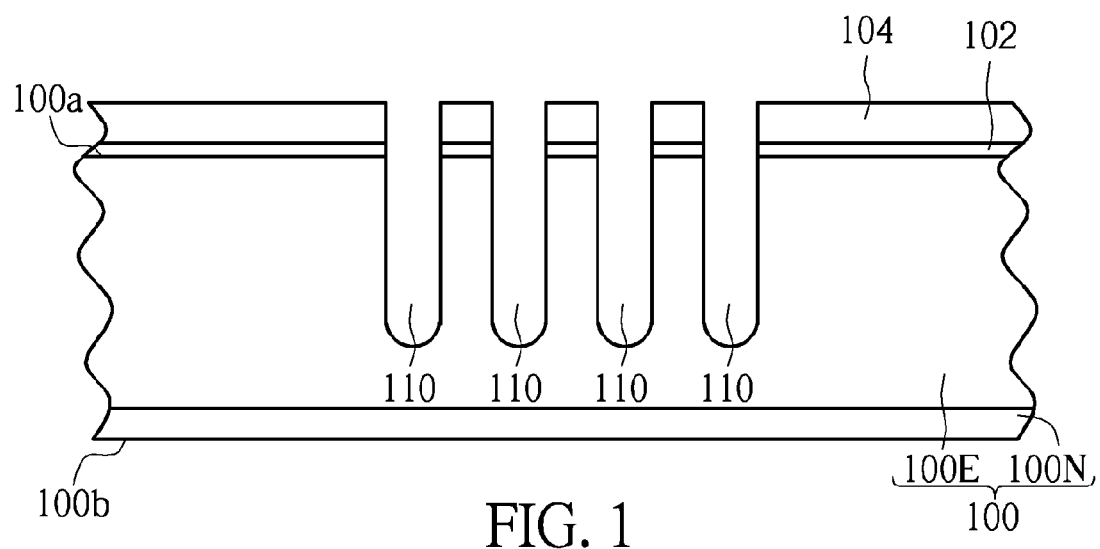

Please refer to FIGS. 1-10 which are drawings illustrating a method for manufacturing an isolation structure integrated with a semiconductor device provided by a preferred embodiment of the present invention. As shown in FIG. 1, a substrate 100 is provided. The substrate 100 includes a first conductivity type, and the first conductivity is an n type in the preferred embodiment. The substrate 100 can include a heavily-doped n-region 100N and an n-typed epitaxial layer 100E formed on the heavily-doped n-region 100N. Furthermore, the substrate 100 includes a front side 100a and a back side 100b opposite to the front side 100a. As shown in FIG. 1, the front side 100a of the substrate 100 is a surface of the n-typed epitaxial layer 100E. Next, a pad layer 102 and a patterned hard mask 104 are formed on the front side 100a of the substrate 100. According to the preferred embodiment, the pad layer 102 can include silicon oxide and the patterned hard mask 104 can include silicon nitride, but not limited to this. As shown in FIG. 1, the patterned hard mask 104 is used to define locations and sizes of a plurality of trenches. Subsequently, a proper etching process is performed to etch the pad layer 102 and the substrate 100 through the patterned hard mask 104 to form the plurality of the trenches 110 in the substrate 100, particularly in the n-typed epitaxial layer 100E. The trenches 110 can be arranged in concentric circles, or in a straight line. It is noteworthy that the number, the size and the location of the trenches 110 are all exemplarily shown in FIG. 1, but not limited to this.

Figure 2:
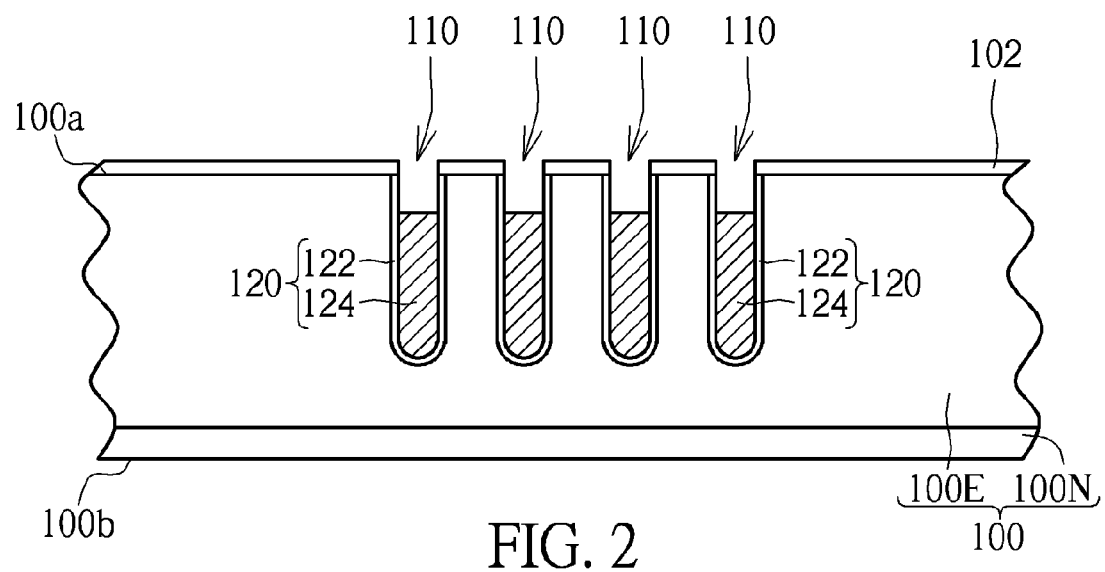

Please refer to FIG. 2. Next, the patterned hard mask 104 is removed and followed by sequentially forming a gate dielectric layer 122 and a gate conductive layer 124 in each trench 110, and the trenches 110 are filled up with the gate conductive layer 124. Consequently, a plurality of trenched gate 120 is formed in the trenches 110, respectively. It is noteworthy that, according to the preferred embodiment, an etching back process is performed to the gate conductive layer 124 after forming the trenched gates 120. Consequently, top surfaces of the trenched gates 120, that are the top surfaces of the gate conductive layers 124 in the trenches 110, are all lower than the openings of trenches 110 as shown in FIG. 2.

Figure 3:
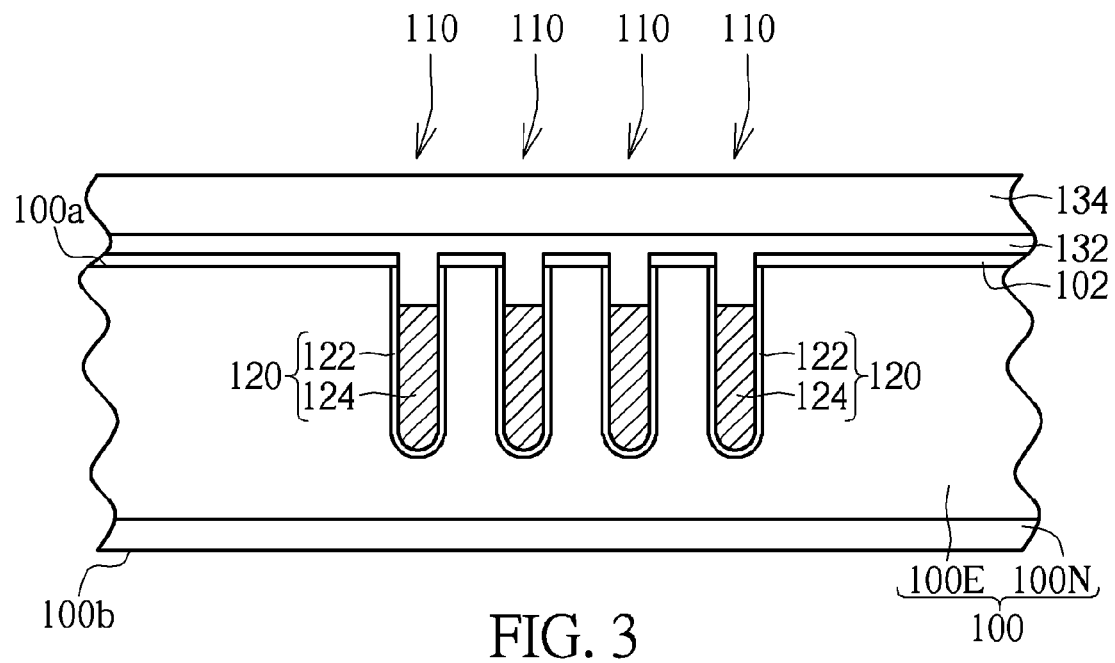

Please refer to FIG. 3. After forming the trenched gates 120, deposition processes are performed to sequentially form a first insulating layer 132 and a second insulating layer 134 on the front side 100a of the substrate 100. It should be noted that an etching rate of the first insulating layer 132 is different from an etching rate of the pad layer 102, and the etching rate of the first insulating layer 132 is also different from an etching rate of the second insulating layer 134. For example, the pad layer 102 includes silicon oxide while the first insulating layer 132 includes silicon nitride, which includes etching rate different from silicon oxide. Furthermore, the second insulating layer 134 includes material having etching rate different from silicon nitride, such as silicon oxide, preferably tetraethylorthosilicate (TEOS), but not limited to this. As shown in FIG. 3, the first insulating layer 132 is blanketly formed to cover the entire front side 100a of the substrate 100. And thus the trenches 110 are filled up with the first insulating layer 132. According to the preferred embodiment, a thickness of the first insulating layer 132 can be 300 Angstrom (Å) and a thickness of the second insulating layer 134 can be 3000 Å, but not limited to this.

Figure 4:
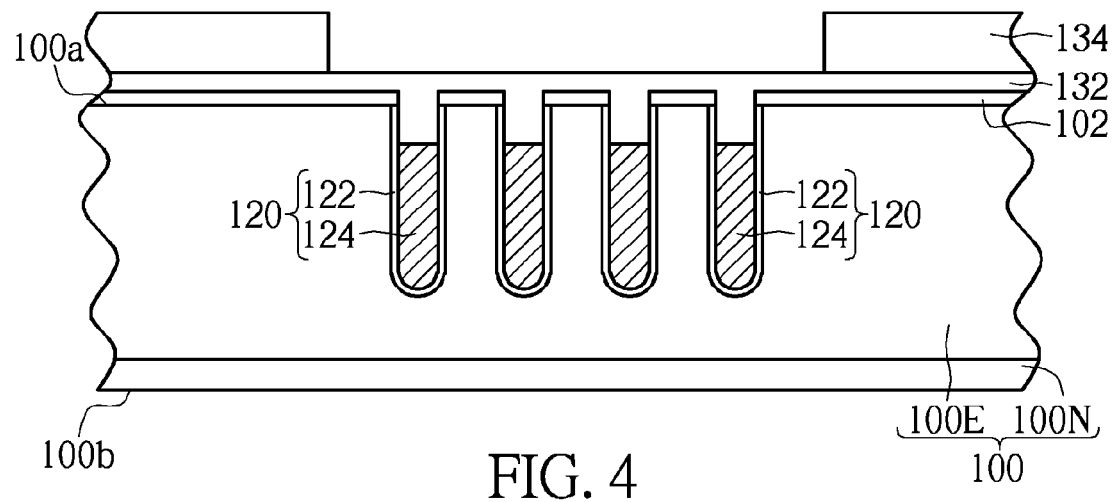

Please refer to FIG. 4. Subsequently, a first etching process 140 is performed to remove portions of the second insulating layer 134 and to expose portions of the first insulating layer 132. The first etching process 140 can be any proper etching process, for example but not limited to, the first etching process 140 can be a dry etching process. It is noteworthy that since the etching rate of the first insulating layer 132 is different from the etching rate of the second insulating layer 134, the first insulating layer 132 serves as an etch stop layer in the first etching process 140. In other words, the first insulating layer 132 protects the underneath gate dielectric layer 122 and pad layer 102 in the first etching process 140.

Figure 5:
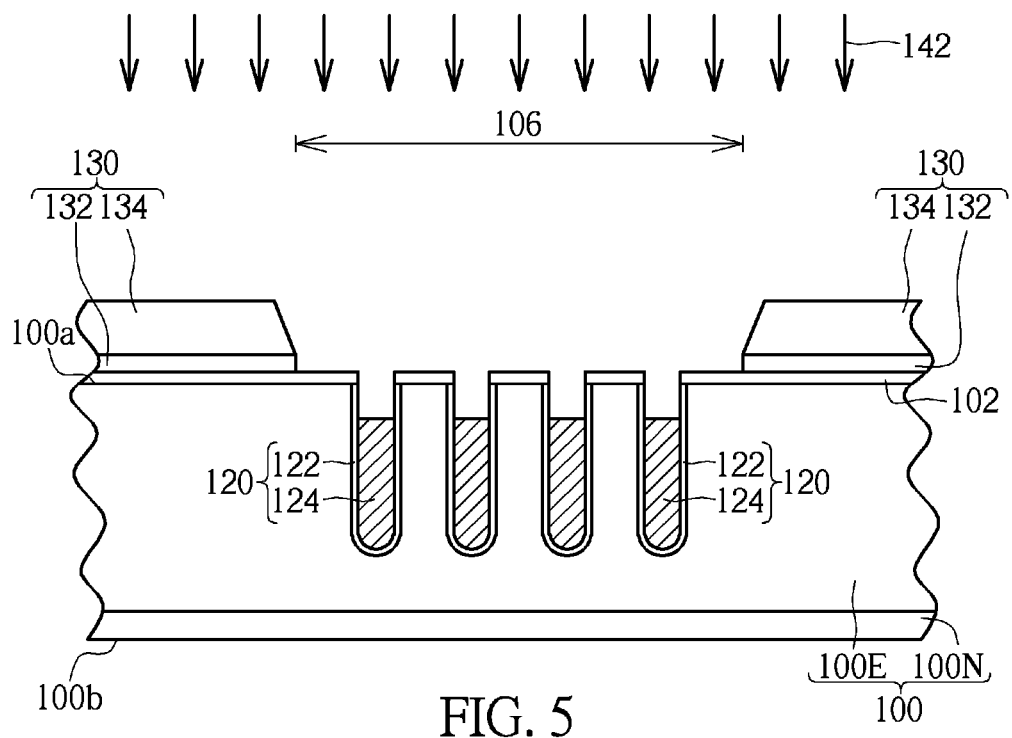

Please refer to FIG. 5. After the first etching process 140, a second etching process 142 is performed to remove the exposed portions of the first insulating layer 132 and thus to expose portions of the trenched gates 120. The second etching process 142 can be any proper etching process, for example but not limited to, the second etching process 142 can be a wet etching process. More important, an isolation structure 130 is formed on the front side 100a of the substrate 100, particularly on the pad layer 102, after the second etching process 142 according to the preferred embodiment. The isolation structure 130 includes at least the first insulating layer 132 and the second insulating layer 134. Because the etching rate of the first insulating layer 132 is different from the etching rate of the gate dielectric layer 122 and of the pad layer 102, both of the gate dielectric layer 122 and the pad layer 102 are imperviously to the second etching process 142. More important, the isolation structure 130 defines at least an active region 106 on the substrate 100. As shown in FIG. 5, the first insulating layer 132 of the isolation structure 130 is sandwiched between the second insulating layer 134 and the pad layer 102. Additionally, because the first insulating layer 132 and the second insulating layer 134 of the isolation structure 130 are formed by deposition processes, a bottom surface of the isolation structure 130, that is a bottom surface of the first insulating layer 132, is higher than the top surfaces of the trenched gates 120, that is the top surfaces of the gate conductive layers 124.

Figure 6:
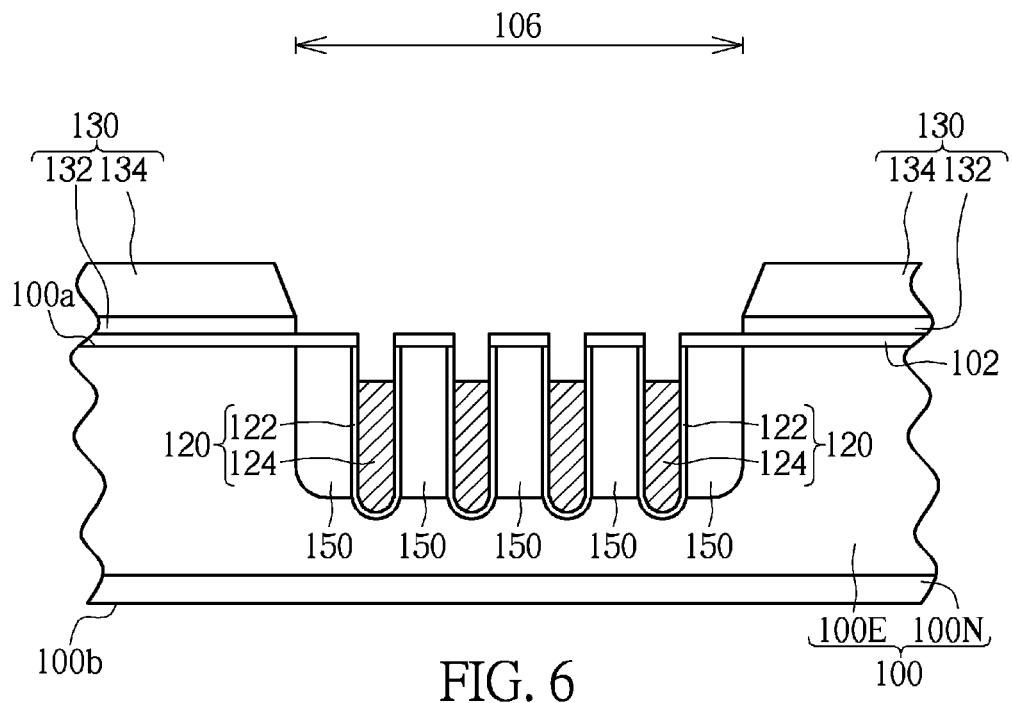

Please refer to FIG. 6. After performing the second etching process 142, an ion implantation is performed with the isolation structure 130 serving as an implant mask. Consequently, abase region 150 is formed in the substrate 100, particularly formed in the n-typed epitaxial layer 100E. The base region 150 includes a second conductivity type, and the second conductivity type is complementary with the first conductivity type. Therefore the base region 150 is a p-based region 150 according to the preferred embodiment.

Figure 7:
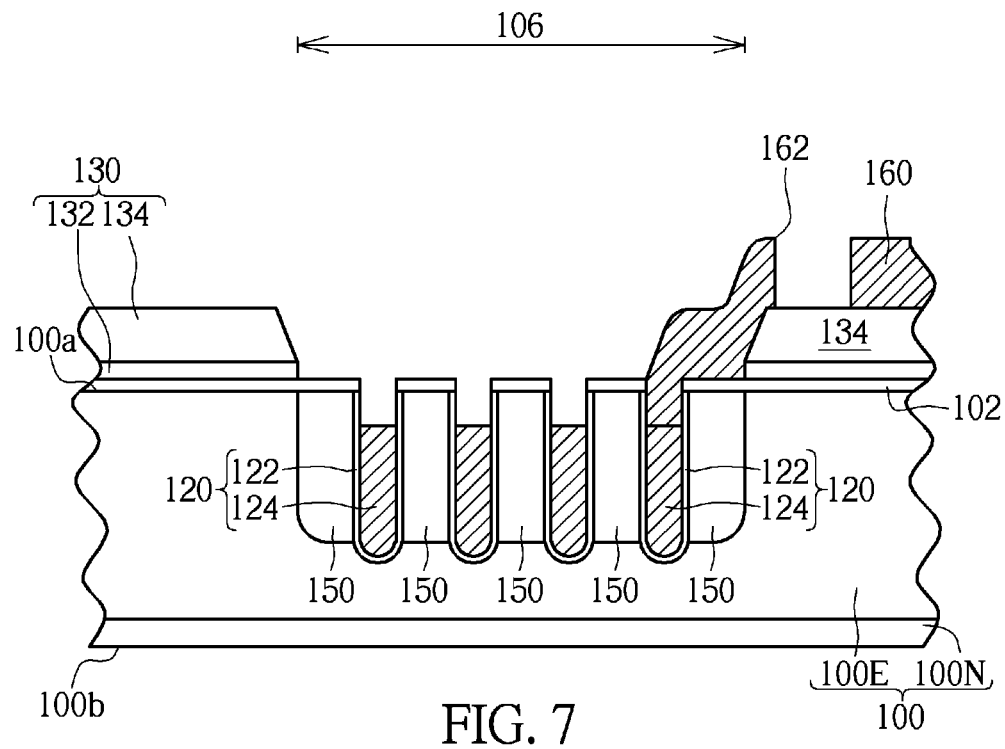

Please refer to FIG. 7. Next, a semiconductor layer 160 is formed on the front side 100a of the substrate 100 and on the second insulating layer 134 of the isolation structure 130. The semiconductor layer 160 is then patterned to format least an electrode 162. As shown in FIG. 7, the electrode 162 strides over the isolation structure 130 and is electrically connected to one of the trenched gates 120.

Figure 8:
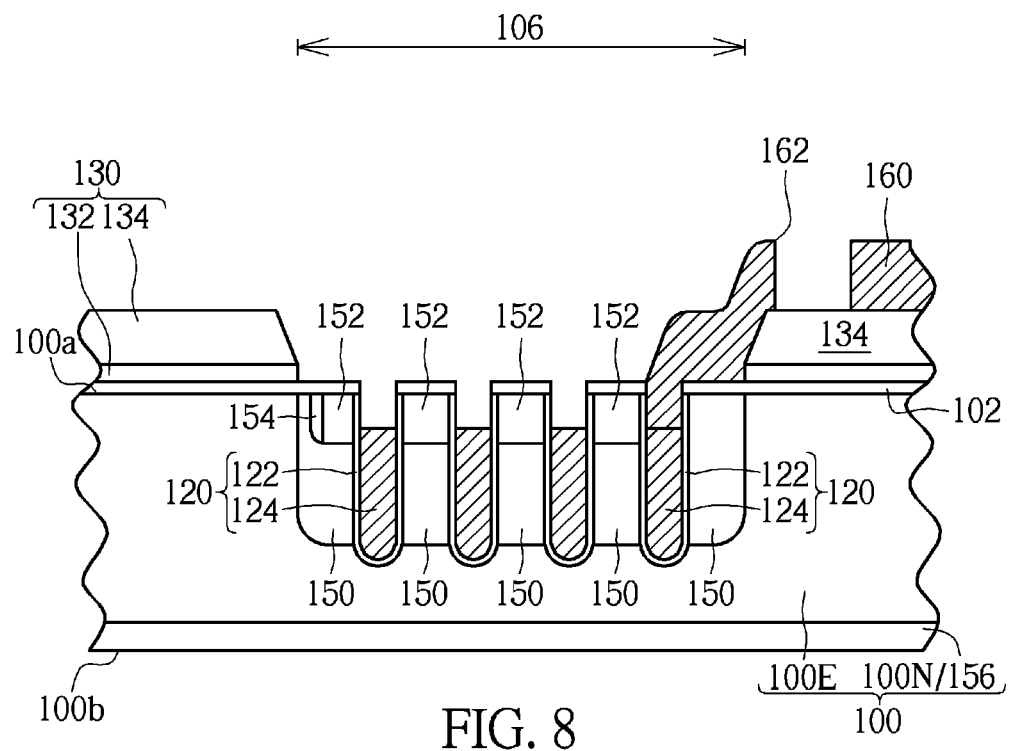

Please refer to FIG. 8. After forming the electrode 162 electrically connected to one of the trenched gates 120, different ion implantations are performed to form a plurality of source regions 152 at two sides of each trenched gate 120 in the substrate 100, and to forma doped region 154 in the base region 150 distal to the electrode 162. The source regions 152 include the first conductivity type while the doped region 154 includes the second conductivity type. Therefore, the preferred embodiment provides n-source regions 152 and a p-doped region 154. It is also noteworthy that the heavily-doped n-region 100N is taken as being formed on the back side 100b of the substrate 100. More important, the heavily-doped n-region 100N serves as a drain region 156.

Figure 9:
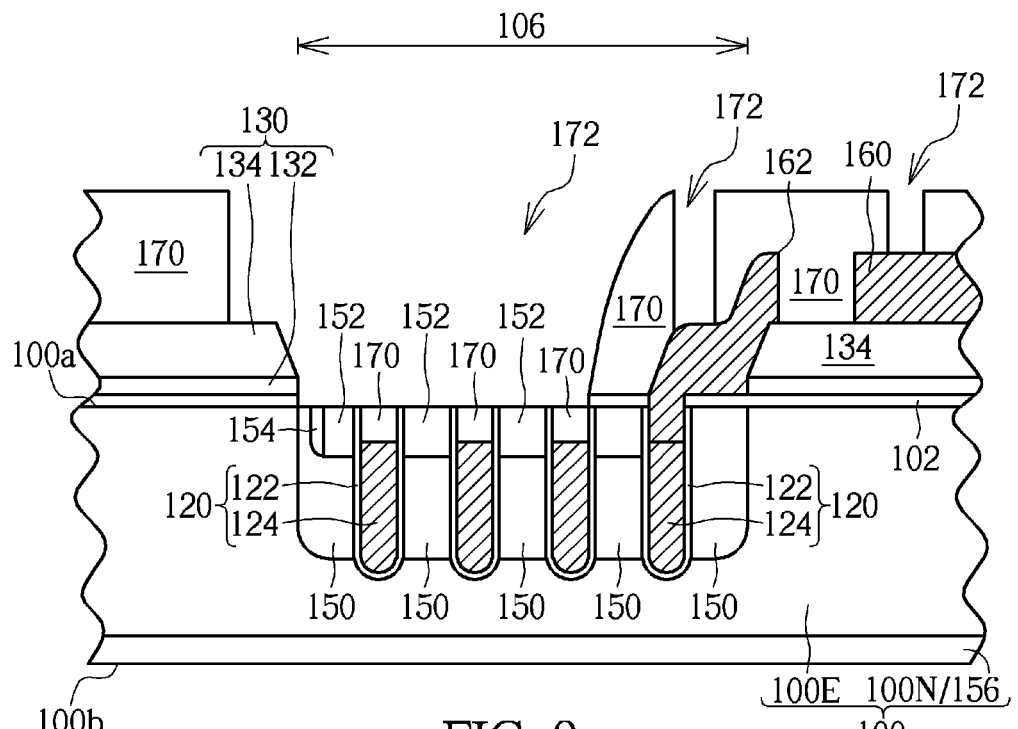

Please refer to FIG. 9. After forming the source regions 152 and the doped region 154, an insulating material layer 170 is formed on the substrate 100. The insulating material layer 170 is blanketly formed on the front side 100a of the substrate 100, and the trenches 110 are filled up with the insulating material layer 170. As shown in FIG. 9, the insulating material layer 170 fills the trenches 110, and thus covers and contacts the top surfaces of the trenched gates 120. Subsequently, the insulating material layer 170 is patterned, and thus a plurality of openings 172 is formed in the insulating material layer 170. As shown in FIG. 9, the openings 172 expose at least a portion of the electrode 162. More important, the openings 172 expose the source regions 152 and the doped region 154 on the front side 100a of the substrate 100. It should be noted that the top surfaces of the trenched gates 120 are still covered and protected by the insulating material layer 170. Next, post-salicide is optionally performed to form silicides (not shown) on silicon surface exposed at bottoms of each opening 172 for reducing contact resistance between the substrate 100 and following formed contacts. However, it should be easily realized by those skilled in the art that the silicide can be formed at different time points.

Figure 10:
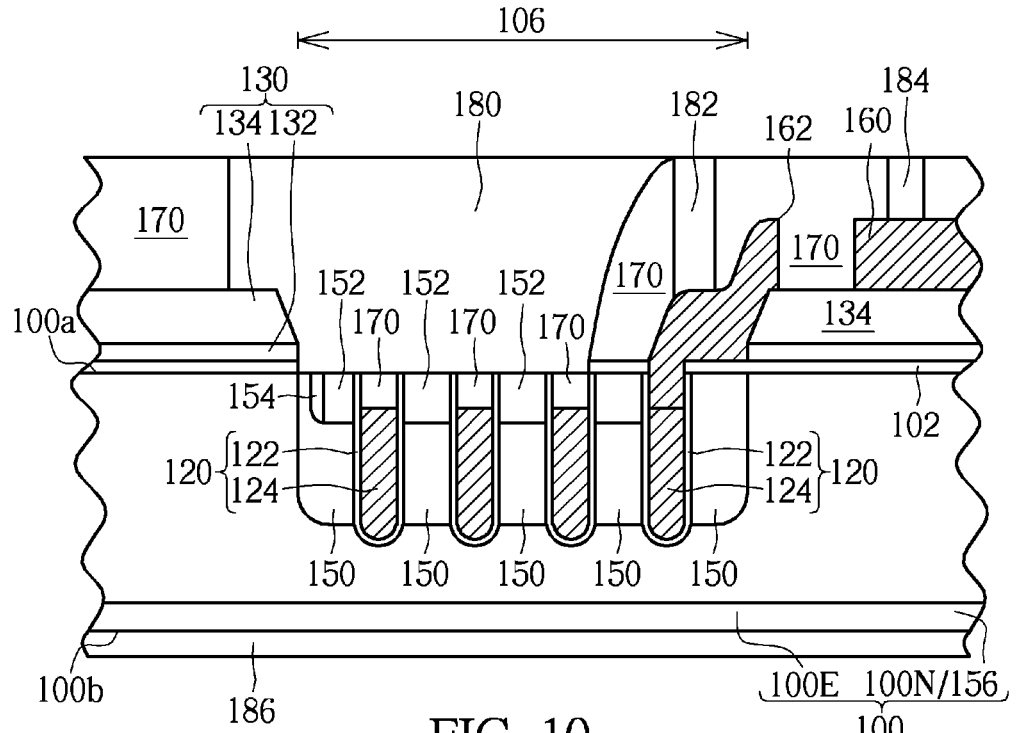

Please refer to FIG. 10. After forming the openings 172 in the insulating material layer 170, a metal material is formed on the front side 100a of the substrate 100 and followed by planarization. Consequently, a first metal layer 180, a second metal layer 182, and a third metal layer 184 are formed. As shown in FIG. 10, the first metal layer 180 is electrically connected to the source regions 152 and the doped region 154, the second metal layer 182 is electrically connected to the electrode 162, and the third metal layer 184 is electrically connected to a patterned semiconductor layer 160. Additionally, a fourth metal layer 186 is formed on the back side 100b of the substrate 100. And thus a vertical double-diffused MOS (VDMOS) is constructed and obtained according to the preferred embodiment.

According to the isolation integrated with the semiconductor device and manufacturing method provided by present invention, the isolation structure used to define the active region(s) and provide electrical isolation is formed by depositions after forming the trenched gates. Since the isolation structure is no longer formed by LOCOS method, high-temperature process is not required. Therefore the isolation structure can be formed at other time point, instead of the beginning the whole manufacturing process. And thus process flexibility is improved. More important, because the isolation structure is formed on the substrate by depositions, silicon consumption and birds' beak effect to the substrate are all avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing an isolation structure integrated with a semiconductor device, comprising:
   providing a substrate;
   forming a pad layer and a patterned hard mask on the substrate;
   forming a plurality of trenched gates in the substrate after forming the pad layer and the patterned hard mask;
   sequentially forming a first insulating layer and a second insulating layer on the substrate after forming the trenched gates, and an etching rate of the first insulating layer being different from an etching rate of the pad layer;
   performing a first etching process to remove portions of the second insulating layer to expose portions of the first insulating layer; and
   performing a second etching process to remove the exposed portion of the first insulating layer to expose the trenched gates and to define at least an active region.

2. A method for manufacturing an isolation structure integrated with a semiconductor device, comprising:
   providing a substrate;
   forming a plurality of trenched gates in the substrate;
   sequentially forming a first insulating layer and a second insulating layer on the substrate after forming the trenched gates;
   performing a first etching process to remove portions of the second insulating layer to expose portions of the first insulating layer;
   performing a second etching process to remove the exposed portion of the first insulating layer to expose the trenched gates and to define at least an active region;
   forming a semiconductor layer on the substrate and the second insulating layer after the second etching process; and
   patterning the semiconductor layer to form at least an electrode electrically connected to one of the trenched gates.

3. The method for manufacturing the isolation structure integrated with the semiconductor device according to claim 2, further comprising forming a base region in the substrate after performing the second etching process.

4. The method for manufacturing the isolation structure integrated with the semiconductor device according to claim 2, wherein an etching rate of the first insulating layer is different from an etching rate of the second insulating layer.

5. The method for manufacturing the isolation structure integrated with the semiconductor device according to claim 4, wherein the second insulating layer comprises a tetraethylorthosilicate (TEOS) layer.

6. The method for manufacturing the isolation structure integrated with the semiconductor device according to claim 5, wherein the first insulating layer comprises a silicon nitride layer.

7. The method for manufacturing the isolation structure integrated with the semiconductor device according to claim 2, further comprising forming a pad layer and a patterned hard mask on the substrate before forming the trenched gates.

8. The method for manufacturing the isolation structure integrated with the semiconductor device according to claim 7, wherein an etching rate of the first insulating layer is different from an etching rate of the pad layer.

9. The method for manufacturing the isolation structure integrated with the semiconductor device according to claim 7, further comprising:
   etching the pad layer and the substrate to form a plurality of trenches in the substrate through the patterned hard mask; and
   forming a gate dielectric layer and a gate conductive layer in each trench to form the trenched gates.

10. The method for manufacturing the isolation structure integrated with the semiconductor device according to claim 2, further comprising forming a plurality of source regions at two sides of each trenched gate in the substrate.

11. The method for manufacturing the isolation structure integrated with the semiconductor device according to claim 6, further comprising forming an insulating material layer on the substrate after forming the source regions.

12. The method for manufacturing the isolation structure integrated with the semiconductor device according to claim 11, wherein the insulating material layer covers tops of the trenched gates.

13. The method for manufacturing the isolation structure integrated with the semiconductor device according to claim 11, further comprising forming a first metal layer in the insulating material layer, the first metal layer being electrically connected to the source regions.

* * * * *